United States Patent [19]

Hudson et al.

[11] Patent Number: 4,719,337

[45] Date of Patent: Jan. 12, 1988

[54] CASH REGISTER COVER

[76] Inventors: Kenneth Hudson, Rte. 2, Box 203, Lowell, Ark. 72745; David E. Gormley, 309 NE. G St., Stigler, Okla. 74462; James E. Dowdy, Rte. 1, Box 390 H, Huntington, Ark. 72940; Edward F. Vampola, 4408 S. 35 Dr., Fort Smith, Ark. 72903

[21] Appl. No.: 1,834

[22] Filed: Jan. 9, 1987

[51] Int. Cl.⁴ .............................................. G06F 1/00
[52] U.S. Cl. .................................. 235/7 R; 235/1 D; 312/108
[58] Field of Search ................... 235/1 D, 1 E, 7 R, 6; 312/7 R, 108

[56] References Cited

U.S. PATENT DOCUMENTS

| | | | |
|---|---|---|---|
| D. 25,012 | 12/1895 | Kirby, Jr. | D18/4 |
| D. 29,346 | 9/1898 | Ringold | D18/4 |
| D. 36,767 | 2/1904 | Jacobi | D18/4 |
| D. 36,768 | 2/1904 | Ringold | D18/4 |
| D. 36,831 | 3/1904 | Ringold | D18/4 |
| 3,756,677 | 9/1973 | Gosswiller | 312/108 |
| 3,763,400 | 10/1973 | Layton et al. | 312/108 |
| 4,027,140 | 5/1977 | Fowler et al. | 235/7 R |

*Primary Examiner*—B. R. Fuller
*Attorney, Agent, or Firm*—John M. Harrison

[57] ABSTRACT

A cash register cover which is designed to enclose and operate a modern cash register and to simulate an ornate, antique mechanical cash register. The cash register cover of this invention is characterized by an interdigitating front panel, side panels and rear panel which rest on the cash box of the enclosed cash register. The cover incorporates a keyboard panel fitted with the keyboard of the enclosed cash register for operating the enclosed cash register and further includes an indication cover that closes the front panel, side panel and rear panel perimeter by means of cooperating mount screws and brackets for easy assembling and disassembling of the cash register cover. In a preferred embodiment, components of the cash register cover are fabricated of a moldable plastic material and the front panel, side panels and rear panel are provided with external decorative ornamentation which simulates the elaborate scroll-work and decoration of antique mechanical cash registers. The cash register cover is provided with adjustable panel mount tabs in order to facilitate quick and easy removal of the cover from the cash box. Adjustable brackets located inside the easily removed indication cover serve to support one or more printed circuit boards of various size, configuration and design, in order to facilitate a wide variation in both numerical and message electronic display function responsive to operation of the cash register cover keyboard.

41 Claims, 11 Drawing Figures

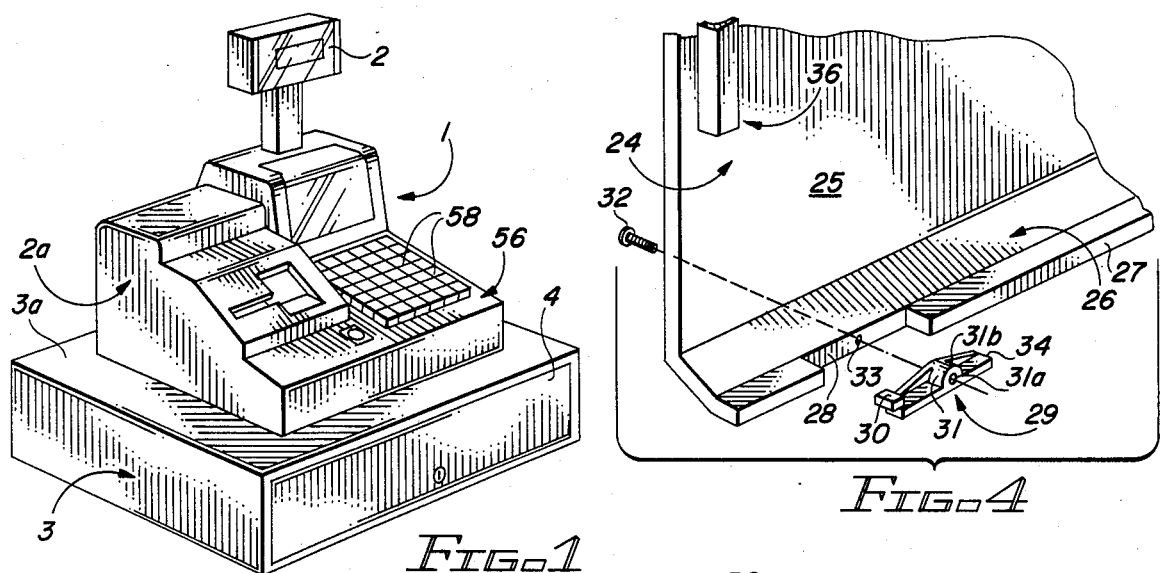
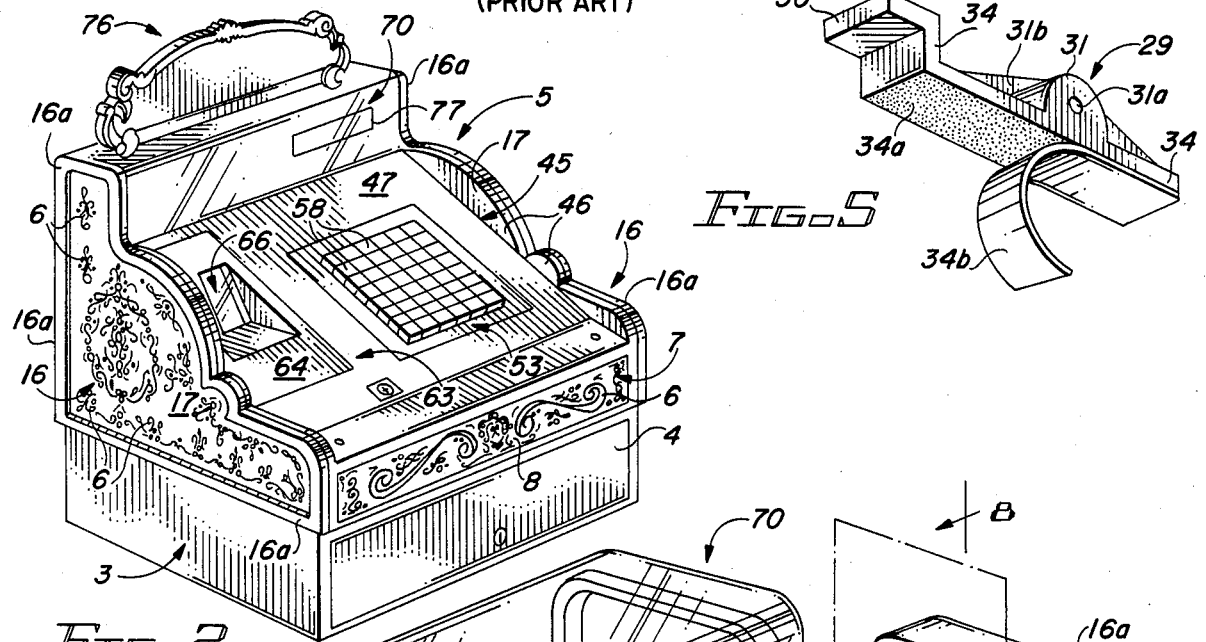

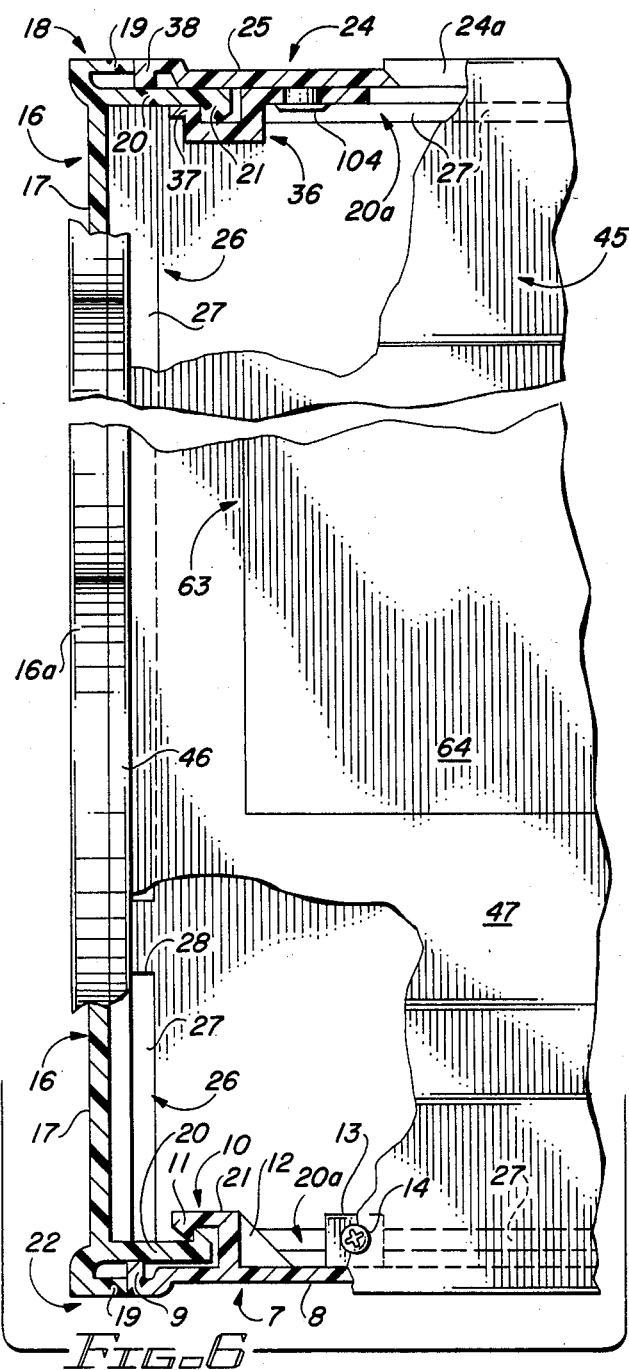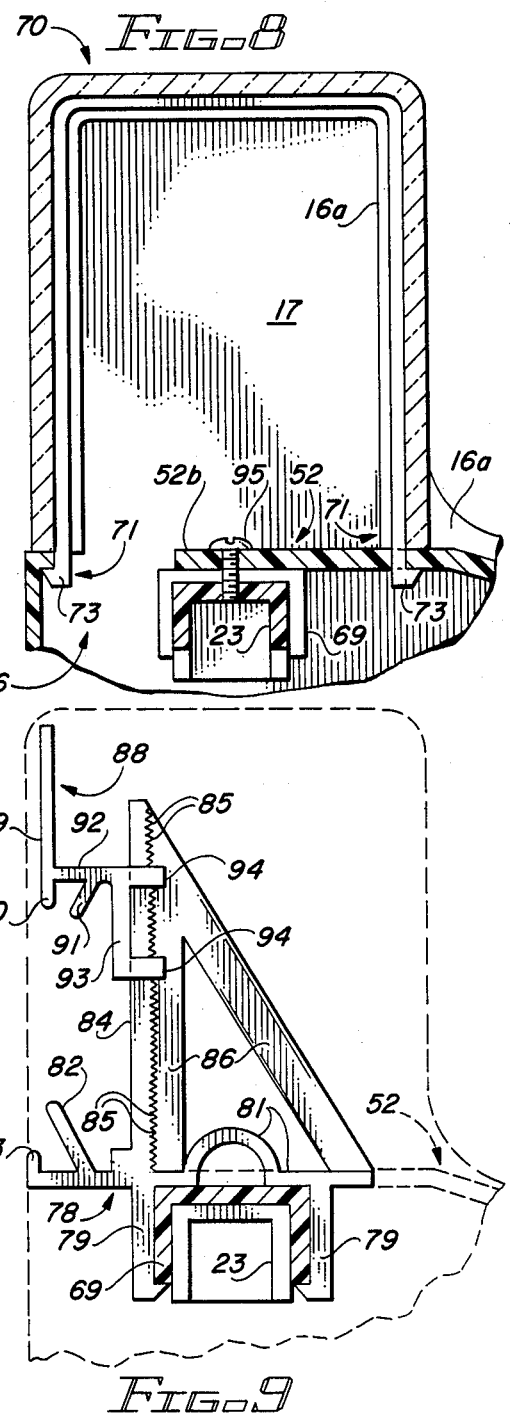

CASH REGISTER COVER

BACKGROUND OF THE INVENTION

1. Field of the Invention

This invention relates to cash registers and more particularly, to a cash register cover for modern electronic cash registers. Specifically, the invention relates to a cash register cover which simulates the decorative external features of antique mechanical cash registers and is characterized by multiple cooperating structural components which are assembled by interlocking brackets. The primary components of the cash register cover of this invention are a front panel, a pair of side panels and a rear panel which slidably interlock to define a box-like perimeter and an indication cover and keyboard panel which removably engage and cover the front panel, side panels and rear panel to complete the basic structure of the cash register cover. These elements enclose the conventional cash register and are designed to rest on the cash box of the cash register. In a preferred embodiment of the invention the front panel, side panels and rear panel are provided with external ornamentation and decorative designs which simulate the appearance of antique mechanical cash registers which are well known to those skilled in the art. Bracket systems which are slidably mounted internally of the indication cover serve to support one or more printed circuit boards of various dimension and design, in order to electronically display alphanumeric messages pursuant to operation of the electronic cash register enclosed by the cash register cover of this invention or independently of such operation, or a mixture of both. A keyboard which is removed from the enclosed cash register and is removably fitted to the keyboard panel and connected electronically to the enclosed cash register, serves to operate the cash register and generate the electronically displayed alphanumeric messages of the printed circuit board(s).

The internal operating components of the older and antique mechanical cash registers, as well as the new electronic cash registers, are well known to those skilled in the art. Generally speaking, modern electronic cash registers are much smaller, lighter and more versatile than the older and antique mechanical counterparts, but are not nearly so ornate and esthetically pleasing to the eye as the older machines. An early, somewhat plain "Case for Cash Registers" is disclosed in U.S. Pat. No. Des. 25,012, dated Dec. 24, 1895, to J. Kirby, Jr. Another design for a "Cash Register Cabinet" is disclosed in U.S. Pat. No. Des. 29,346, dated Sept. 13, 1898, to E. Ringold. The Ringold cash register cabinet design is quite ornate and is typical of cash register cabinet designs at the turn-of-the-century. Another antique "Cash Register Cabinet or Casing" is disclosed in U.S. Pat. No. Des. 36,767, dated Feb. 2, 1904, to L. Jacobi. This cash register cabinet design is also typical of the turn-of-the-century mechanical cash registers known to those skilled in the art. Even more ornate "Cash Register Cabinet or Casing" designs are disclosed in U.S. Pat. Nos. Des. 36,768, dated Feb. 2, 1904, and 36,831, dated Mar. 1, 1904, to E. Ringold.

It is an object of this invention to provide a decorative and functional cash register cover for enclosing and operating a cash register, which cover is characterized by an interlocking front panel, side panels, rear panel, indication cover and keyboard panel removed from the enclosed cash register, that are designed to fit over the conventional cash register and rest on the cash box of the cash register.

Another object of this invention is to provide a new and improved cash register cover for enclosing and operating a conventional and/or electronic cash register and seating on the cash box of the cash register, which cover is characterized by interlocking side panels, front panel, rear panel, indication cover and keyboard panel and adjustable brackets located beneath the indication cover to support at least one printed circuit board of selected design for displaying a wide variety of alphanumeric messages.

Still another object of the invention is to provide a cash register cover which is designed to enclose and operate an electronic cash register and rest on the cash box of the cash register, which cover is provided with interlocking, ornate and decorative side panels, front panel and rear panel and a keyboard cover and indication cover removably fitted to the front panel, side panels and rear panel, such that the cash register cover resembles an antique mechanical cash register, but operates in accordance with the features of the enclosed electronic cash register.

A still further object of this invention is to provide a cash register cover of ornate and ornamental design for covering and operating a conventional electronic cash register, which cover includes a decorative front panel and rear panel that interlock with a pair of decorative side panels to shape a box-like structure which encompasses the electronic cash register. A keyboard panel and indication cover substantially close the top of the cash register cover and a keyboard bezel and keyboard which is removed from the enclosed cash register, along with a door plate provided with a paper slot and paper shield for receiving printer paper from the cash register printer, are provided in the cash register cover.

Yet another object of this invention is to provide a cash register cover for enclosing and operating an electronic cash register, which cash register cover is secured to the cash box of the cash register by means of specially designed mount tabs and is characterized by injection-molded, assembled components that interlock and interdigitate to simulate ornate, antique mechanical cash registers and yet provides a wide variety of state-of-the-art electronic functions which are compatible with the design of the enclosed electronic cash register.

Another object of the invention is to provide a cash register cover for enclosing and operating a modern cash register, which cover includes an ornate, decorative, assembled front panel, side panels and rear panel, an indication cover and a keyboard panel removed from the enclosed cash register, and further includes a snap-in keyboard, which receives the conventional keyboard panel and electronically communicates with the keyboard panel function of the enclosed cash register and a printer access feature which utilizes the conventional printer, relocated on a printer mount chassis, provided in the enclosed cash register. Numerals and messages are displayed on printed circuit boards supported by slidably adjustable brackets located inside the indication cover and mount tabs secured to the cash box of the cash register cooperate with slots in the cash register cover panels to removably secure the cash register cover to the cash box.

SUMMARY OF THE INVENTION

These and other objects of the invention are provided in a new and improved cash register cover for enclosing and operating conventional cash registers and electronic cash registers in particular, which cash register cover is removably secured to the cash box of the cash register by multiple mount tabs. The cash register cover is assembled from a set of interdigitating side panels, front panel, rear panel, indication cover and keyboard panel and in a preferred embodiment, the front panel, side panels and rear panel are injection-molded with surface ornamentation and indicia to resemble and simulate an antique, mechanical cash register. Adjustable brackets located inside the indication cover are designed to accommodate one or more printed circuit boards of various size, in order to facilitate indication of alphanumeric messages which reflect the state-of-the-art electronic capability of the enclosed cash register. A keyboard, removed from the enclosed cash register and mounted in association with the keyboard panel, is electrically connected to the keyboard circuitry of the enclosed cash register, for operating the cash register and effecting display of the alphanumeric messages.

BRIEF DESCRIPTION OF THE DRAWINGS

The invention will be better understood by reference to the accompanying drawings, wherein:

FIG. 1 is a perspective view of a conventional electronic cash register and cash drawer;

FIG. 2 is a perspective view of a preferred embodiment of the cash register cover of this invention enclosing the conventional cash register illustrated in FIG. 1 and resting on the cash box of the conventional cash register;

FIG. 4 is an enlarged view of a rear panel mount tab configuration illustrated in FIG. 3;

FIG. 5 is an enlarged perspective view of the panel mount tab illustrated in FIGS. 2 and 4.

FIG. 6 is a top view, partially in section, of the cash register cover with the printer mount chassis removed, illustrating a preferred interlocking bracket design for interdigitating the front panel, side panels and rear panels;

FIG. 7 is an exploded view of a first preferred indication bracket combination for supporting one or more printed circuit boards inside the indication cover of the cash register cover illustrated in FIG. 2;

FIG. 8 is an end sectional view taken along line 8—8 in FIG. 7, of a preferred mount for the keyboard panel and indication mount bar;

FIG. 9 is a side elevation of the assembled indication bracket combination illustrated in FIG. 7, mounted on the mount bar, with a side panel illustrated in phantom;

DESCRIPTION OF THE PREFERRED EMBODIMENTS

Figure 3:
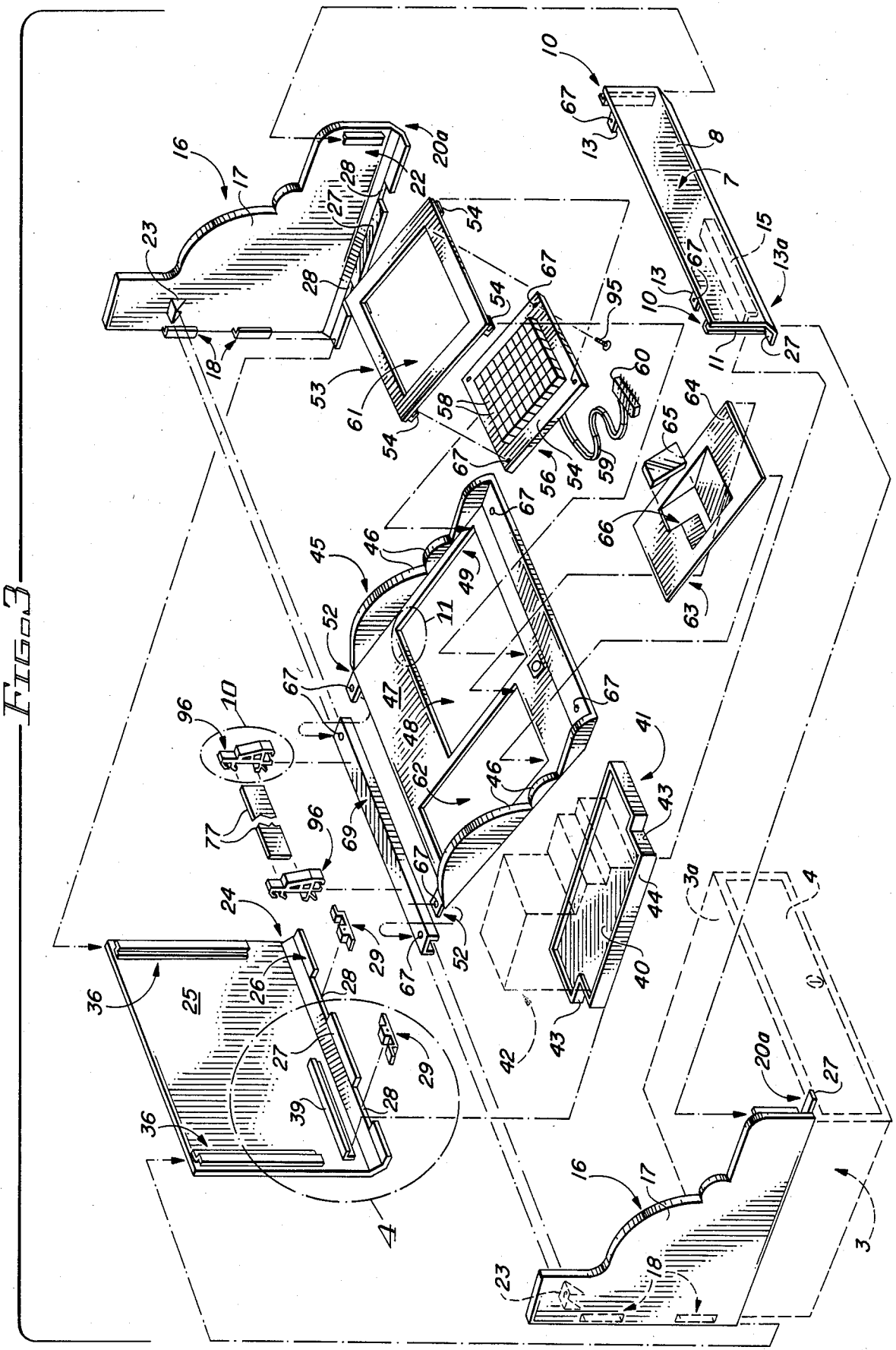
FIG. 3 is an exploded view of the cash register cover illustrated in FIG. 2, but without panel ornamentation or decoration and with the cash box of the conventional cash register outlined in phantom.

Referring initially to FIG. 1 of the drawings, a cash register of conventional and modern design is generally illustrated by reference numeral 1. The cash register 1 includes an indication or display 2, mounted on a cover panel 2a and rests on the top surface 3a of a cash box 3, provided with a conventional cash drawer 4. The cash register 1 is typically modern and electronic in design and operation and is small and light in weight.

Referring now to FIGS. 2 and 3 of the drawings, in a preferred embodiment the cash register cover of this invention is generally illustrated by reference numeral 5. The cash register cover 5 includes a front panel 7, a pair of matching side panels 16 and a rear panel 24, which interdigitate to define a box-like perimeter that is closed at the top by a keyboard panel 45 and a cooperating indication cover 70. The front panel 7, side panels 16 and rear panel 24 rest on the top surface 3a of the conventional cash box 3, in order to facilitate clearance of the cash drawer 4 when the enclosed cash register 1 is operated with the cash register cover 5 in functional position as illustrated in FIG. 2 and as hereinafter further described. In a most preferred embodiment of the invention the front panel 7, side panels 16 and rear panel 24 are provided with surface ornamentation and decorative indicia 6, which closely simulates the surface ornamentation of antique mechanical cash registers, the designs of which are referred to hereinabove and well known to those skilled in the art.

Referring now to FIGS. 3 and 6 of the drawings the front panel 7 is characterized by a flat front panel plate 8 terminated at each end by an inwardly extending front panel plate stop 9 and including a pair of spaced apart, inwardly extending front panel inside brackets 10, as illustrated in FIG. 6. Each of the front panel inside brackets 10 is further characterized by a projecting front panel inside bracket finger 11 and a front inside bracket gusset 12, which extends between the front panel inside bracket 10 and the front panel plate 8, in order to strengthen the front panel inside bracket 10. A pair of front panel mount tabs 13 project inwardly from the top edge of the front panel plate 8 in spaced relationship with respect to each other between the front panel inside brackets 10. The front panel mount tabs 13 are drilled or apertured to accommodate a pair of tab screws 14, which are designed to secure the front edge of the keyboard panel plate 47 of the keyboard panel 45 to the front panel 7, as illustrated in FIG. 6. When installed in this capacity, the tab screws 14, illustrated in FIG. 6, register with matching fastener openings 67 located in the keyboard panel plate 47, as illustrated in FIG. 3 and threadibly engage the fastener openings 67, provided in the front panel mount tabs 13 and the keyboard panel plate 47. A front panel bottom flange 13a projects downwardly and inwardly from the bottom edge of the front panel plate 8 to define a flange lip 27, which accommodates a pair of spaced flange lip slots (not illustrated) designed to receive a pair of panel mount tabs 29, for removably securing the front panel 7 of the cash register cover 5 to the cash box 3, as hereinafter further described. A front chassis mount bracket 15 is secured to the inside surface of the front panel plate 8 in order to support one end of the printer mount chassis 41, which supports the printer 42 (illustrated in phantom in FIG. 3) removed from the conventional cash register 1, as further hereinafter described.

Referring again to FIGS. 2, 3 and 6 of the drawings, each of the side panels 16 is characterized by a flat, shaped side panel plate 17, bordered with a side panel border 16a and provided with a pair of spaced rear side panel brackets 18 and a companion front side panel bracket 22. The rear side panel brackets 18 and the front side panel brackets 22 are each provided with an inwardly extending side panel stop 19, which engages a corresponding front panel plate stop 9, respectively, extending from each end of the front panel plate 8, as illustrated in FIG. 6. A pair of side panel retainers 20 also extend inwardly, in spaced, parallel relationship with respect to the side panel stops 19, from the side panel plates 17 of the side panels 16, respectively, and terminate in a pair of retain fingers 21, respectively, each of which retainer fingers 21 engages the front inside bracket finger 11 of a corresponding front panel inside bracket 10, extending from each end of the front panel plate 8 of the front panel 7. Accordingly, it will be appreciated that the front panel 7 is secured to the front edges of the side panels 16 by aligning and slidably engaging the side panel retainers 20 in the corresponding front panel inside brackets 10 and the side panel stops 19 against the companion front panel plate stops 9, respectively, one of which is illustrated in FIG. 6. The side panel plates 17 of the side panels 16 are also each provided with an apertured indicator bar seat 23, which supports one end of an indication mount bar 69 that spans the distance between the side panels 16, as illustrated in FIG. 3, for purposes which will be hereinafter discussed.

A side panel bottom flange 20a projects downwardly and inwardly from the bottom edges of the side panel plates 17, respectively, to define a pair of facing flange lips 27. Like the flange lip 27 provided in the front panel bottom flange 13a of the front panel 7, the flange lip 27 located in each of the side panel bottom flanges 20a includes a pair of spaced flange lip slots 28, for optionally receiving a pair of the panel mount tabs 29 and mounting the side panels 16 to the cash box 3, as hereinafter further described. As further illustrated in FIGS. 3 and 6 of the drawings a rear panel 24 spans the rear edges of the side panels 16 and is further characterized by a flat rear panel plate 25, fitted with an inwardly extending rear panel inside bracket 36 on each end thereof. Each of the rear panel inside brackets 36 is further characterized by a rear inside bracket finger 37 and is secured to the rear panel plate 25 by means of a sonic weld 104. The rear panel plate 25 is terminated at each end by an inwardly extending rear panel plate stop 38, which seats against a companion side panel retainer 20, respectively, provided in each of the side panel plates 17, when the retainer finger 21 in each of the side panel plates 17 engages a corresponding rear panel inside bracket 36, as the spaced side panels 16 interlock with the rear panel 24. As further illustrated in FIG. 3, a rear chassis mount bracket 39 is molded or otherwise secured to the inside surface of the rear panel plate 25 opposite the front chassis mount bracket 15, secured to the inside surface of the front panel plate 8, for supporting the opposite end of the printer mount chassis 41. A rear panel bottom flange 26 extends downwardly and inwardly from the bottom edge of the rear panel plate 25 as illustrated in FIG. 3 and as further detailed in FIG. 4, and terminates in a bottom flange lip 27. A pair of bottom flange lip slots 28 are provided in spaced relationship in the bottom flange lip 27, in order to accommodate a pair of the panel mount tabs 29, which are further detailed in FIG. 5. Each of the panel mount tabs 29 are characterized by a tab flange 30, which projects in offset relationship from a tab base 34. An adhesive 34a is applied to the bottom surface of each tab base 34 and is covered by an adhesive cover strip 34b prior to mounting the panel mount tabs 29 on the top surface 3a of the cash box 3 when the cash register cover 5 is installed over the cash register 1, as illustrated in FIG. 2. A tab screw receptacle 31 projects from the tab base 34 and is provided with a receptacle opening 31a for receiving a tab mount screw 32, as illustrated in FIG. 4. The tab mount screw 32 is designed to register with a tab mount screw opening 33 provided in the rear panel bottom flange 27 of the rear panel plate 25 and threadibly engage the receptacle opening 31a in the tab screw 31, to secure the rear panel 24 to the panel mount tabs 29. A receptacle gusset 31b extends from both sides of the tab screw receptacle 31 to the tab base 34, in order to strengthen the tab screw receptacle 31. It is important that each of the flange lip slots 28 in the respective flange lips 27 are wider than the companion panel mount tabs 29, in order to facilitate slidable displacement of the cash register cover 5 with respect to the panel mount tabs 29 to remove the cash register cover 5 from the top surface 3a of the cash box 3, as hereinafter described.

Figure 11:
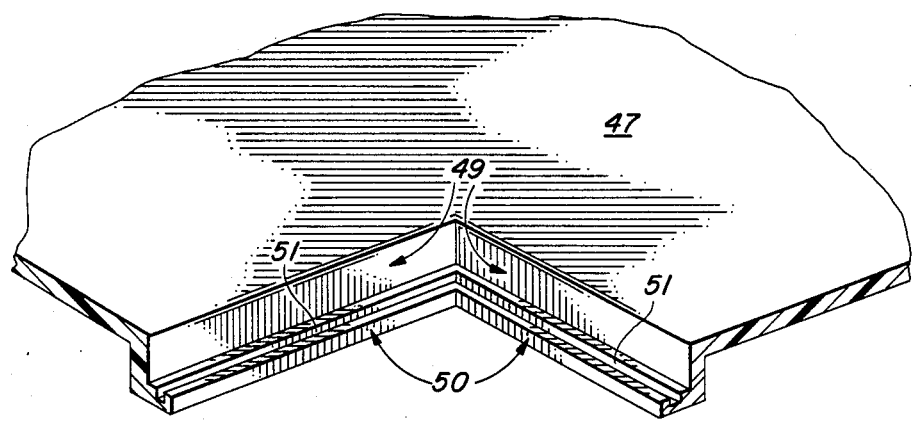
FIG. 11 is an enlarged view of a preferred bezel opening perimeter illustrated in FIG. 3.

Referring to FIGS. 3, 7 and 8 of the drawings the keyboard panel plate 47 of the keyboard panel 45 is characterized by a pair of upwardly-extending, parallel keyboard panel flanges 46 that match the curvature of each of the side panel plates 17. A pair keyboard panel mount tabs 52, having mount tab fingers 52b extending therefrom, also project from the rear end of keyboard panel plate 47 and the mount tab fingers 52b are provided with a pair of fastener openings 67 therein for securing the keyboard panel plate 47 to the indicator bar seats 23 and anchoring each end of the indication mount bar 69. A pair of mount screws 95 serve to secure the keyboard panel mount tabs 52 to the indicator bar seats 23 with the indication mount bar 69 sandwiched therebetween and captured therein, as further illustrated in FIG. 8. A keyboard bezel opening 48, defined by a bezel opening perimeter 49, is also provided in the keyboard panel plate 47, as illustrated in FIG. 3. In another most preferred embodiment of the invention, the bezel opening perimeter 49 is configured as illustrated in FIG. 11, with a drain channel 50, provided with a central channel slot 51, in order to capture and drain liquid spilled from the keyboard panel plate 47. A keyboard bezel 53 is designed to register with the keyboard bezel opening 48 in the keyboard panel plate 47 and is retained in the position illustrated in FIG. 2 by means of four keyboard bezel tabs 54, which engage the bezel opening perimeter 49 in the keyboard panel plate 47, as illustrated in FIG. 3. The keyboard 56, which is removed from the cash register 1, contains multiple keys 58 which project from a keyboard plate 57 and the keys 58 are designed to project through a key opening 61 provided in the keyboard bezel 53, when the keyboard plate 57 is secured to the keyboard bezel 53 by means of the mount screws 95, as illustrated in FIG. 3. A pigtail or umbilical 59 projects from the keyboard 56 and is terminated by a pigtail connector 60, which is plugged into an electronic circuit (not illustrated) in the cash register 1, in order to facilitate operation of the enclosed conventional cash register 1 by manipulating the keys 58. A printer access opening 62 is also provided in the keyboard panel plate 47 and is designed to accommodate a printer access door 63, which includes a door plate 64, fitted with a conventional paper shield 65. A paper slot 66 is provided in the door plate 64 in conventional fashion and is designed to receive printer paper from the printer 42 (illustrated in phantom) which is mounted on the chassis base 40 of the printer mount chassis 41, located beneath the printer access door 63. The chassis slots 43 provided in the printer mount chassis 41 serve to accommodate the front panel inside bracket 10 and the rear panel inside bracket 36 located in the front panel plate 8 and the rear panel plate 25 respector Referring again to FIGS. 3 and 7 of the drawings in yet another preferred embodiment of the invention, the translucent or transparent indication cover 70 is mounted inside the side panels 16, with the end edges thereof recessed in a side panel border slot 75 provided in each of the side panel borders 16a. An indication cover bracket 71 is attached to each end of the indication cover 70 and incorporates a pair of outwardly extending cover bracket fingers 73, each having a cover bracket slot 72, two of which cover bracket fingers 73 and cover bracket slots 72 engage spaced border slots 74 located in the rear panel border 24a of the rear panel 24, respectively. The cover bracket slots 72 of the opposite cover bracket fingers 73 engage the mount tab edges 52a of the spaced mount tabs 52, which extend from the keyboard panel plate 47.

As further illustrated in FIGS. 3, 7 and 9, an indication printed circuit board 77 is supported beneath the indication cover 70 by a serrated indication mount bracket 78, mounted on the indication mount bar 69 in cooperation with a travelling bracket 88. The serrated indication mount bracket 78 includes a pair of downwardly extending, spaced mount bar fingers 79, which are fitted with inwardly extending and facing fingertips 80 for slidably engaging the indication mount bar 69. The mount bar fingers 79 each extend from a serrated mount base plate 81, which is further provided with a base plate finger 82 that extends outwardly and upwardly from the serrated mount base plate 81 in angular relationship adjacent an upward-turned base plate lip 83, which terminates one end of the serrated mount base plate 81. An upward-standing, serrated plate 84 also projects from the serrated mount base plate 81 and is fitted with multiple serrations 85. A plate brace 86 projects from the serrated mount base plate 81 to the top of the serrated plate 84 in angular relationship, in order to brace the serrated plate 84 with respect to the serrated mount base plate 81. The traveling bracket 88 is designed to slidably cooperate with the serrated plate 84 of the serrated indication mount 78 by means of three base clips 94, which are secured to the traveling bracket base 93, as illustrated in FIG. 7. A seat 92 connects the parallel traveling bracket base 93 and traveling bracket flange 89 and a traveling bracket finger 91 projects outwardly and downwardly in angular relationship from the traveling from the traveling bracket bracket flange lip 90, which extends downwardly from the traveling bracket flange 89. Accordingly, it will be appreciated that when the traveling bracket 88 is slidably secured to the serrated plate 84 of the serrated indication mount 78 and the indication printed circuit board 77 is inserted between the traveling bracket flange lip 90 and the traveling bracket finger 91 and between the base plate lip 83 and the base plate finger 82, respectively, in slidable relationship, the indication printed circuit board 77 is functionally mounted for enclosure inside the indication cover 70 Since the traveling bracket 88 is slidably mounted on the serrated plate 84, printed circuit boards 77 of various heights can be mounted on the serrated indication mount bracket 78 and traveling bracket 88 by linearly adjusting the traveling bracket 88 on the serrated plate 84.

Figure 10:
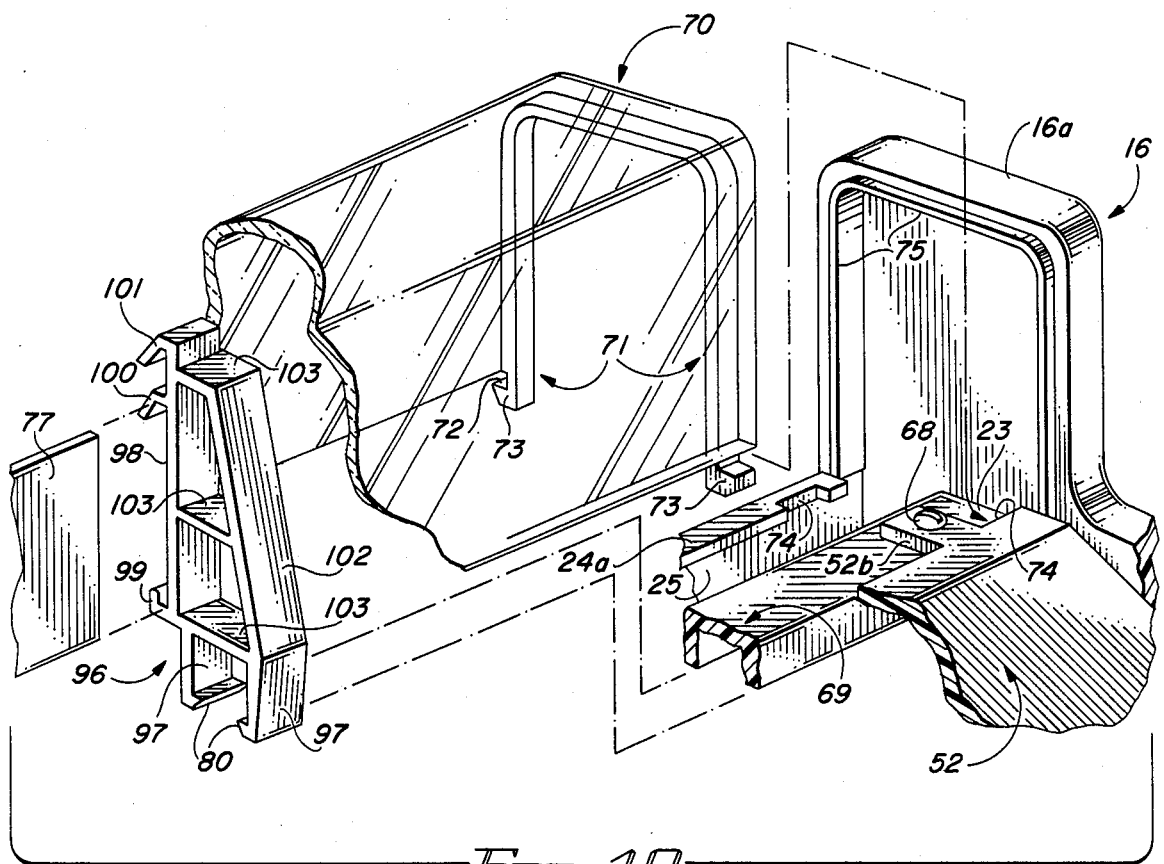
FIG. 10 is an alternative preferred embodiment of the indication bracket for mounting printed circuit boards inside the indication cover of the cash register cover illustrated in FIG. 2.

In another preferred embodiment of the invention and referring to FIG. 10 of the drawings, a universal bracket 96 serves the same function as the combination serrated indication mount bracket 78 and traveling bracket 88 illustrated in FIG. 7, except that the universal bracket 96 is designed to receive indication printed circuit boards 77 having two separate heights only. The universal bracket 96 is characterized by a pair of downwardly extending, spaced universal mount fingers 97, which extend from a bottom universal bracket rib 103 and are each provided with inwardly extending, facing fingertips 80 for slidably engaging the indication mount bar 69, as illustrated in FIG. 10. A bracket display plate 98 is spaced from a cooperating support plate 102 by additional universal bracket ribs 103 and is further provided with an upwardly projecting bottom display plate finger 99 and an opposed, downwardly extending middle display plate finger 100 and similarly oriented top display plate finger 101, in order to receive and support an indication printed circuit board 77, as illustrated. If a narrow indication printed circuit board 77 is to be mounted in the universal bracket 96, it is inserted between the bottom display plate finger 99 and the middle display plate finger 100. However, if a wider indication printed circuit board 77 is to be mounted in the universal bracket 96, the middle display plate finger 100 must be severed from the bracket display plate 98 and the indication printed circuit board 77 then inserted between the bottom display plate finger 99 and the top display plate finger 101.

Referring again to FIG. 2 of the drawings, in another most preferred embodiment of the invention a decorative panel 76 is mounted to the top surface of the indication cover 70 for decorative and fixed display or advertising purposes, as desired. As further illustrated in FIG. 2, it will be appreciated by those skilled in the art that numerals and/or messages displayed on one or more indication printed circuit boards 77 which are mounted inside the indication cover 70 can be easily seen through the transparent or translucent indication mount cover 70. Furthermore, referring again to FIGS. 2 and 3, since the keys 58 are electrically connected to the electronic circuitry in the cash register 1 by means of the pigtail 59 and the pigtail connector 60, the enclosed cash register 1 is operated by manipulating the keys 58 mounted in the cash register cover 5. Furthermore, as illustrated in FIG. 3, the relocated conventional printer 42 is also operated by the relocated keyboard 56 and keys 58 and printer paper (not illustrated) projects through the paper slot 66 in the door plate 64 in order to provide a printed receipt for the customer. Since the cash register cover 5 is mounted on the top surface 3a of the cash box 3, the cash drawer 4 is easily accessible and operates in conventional fashion according to a selected operational sequence of the keys 58.

Referring again to FIGS. 4 and 5 of the drawings, for installation of the cash register cover 5 on the cash register 1, the panel mount tabs 29 are first positioned on the top surface 3a of the cash box 3 in registration with the respective flange lip slots 28 located in the flange lips 27 in the front panel bottom flange 13a and/or the rear panel bottom flange 26. The tab mount screws 31 can then be inserted through the tab mount screw openings 33 and the panel mount tabs 29 removably secured to the front panel bottom flange 13a and/or the rear panel bottom flange 26 in the oversized flange lip slots 28, as illustrated. It will be further appreciated that other panel mount tabs 29 can be located in the flange lip slots 28 provided in the flange lips 27 of the side panel bottom flanges 20a, as illustrated in FIG. 3, if desired, as an alternative means of securing the cash register cover 5 to the cash box 3. When the panel mount tabs 29 are so installed in the flange lip slots 28 of the flange lips 27 in the front panel bottom flange 13a and rear panel bottom flange 26, the adhesive cover strip 34b which covers the adhesive 34a located on the bottom surface of the tab base 34, is removed. The cash register cover 5 is then carefully positioned on the top surface 3a of the cash box 3 as illustrated in FIG. 2, such that the adhesive 34a adheres to the top surface 3a and secures the cash register cover 5 to the cash box 3. Accordingly, when it is desired to remove the cash register cover 5 from the cash box 3 without disassembling the cash register cover 5, the tab mount screws 32 are removed from each of the fixed panel mount tabs 29 and from the front panel bottom flange 13a and the rear panel bottom flange 26. The cash register cover 5 is then shifted to the left in the direction of the arrow located on the cash drawer 4, as illustrated in FIG. 2, to displace the tab flanges 30 of each of the panel mount tabs 29 from engagement with the corresponding flange lips 27 and into alignment with the flange lip slots 28. This action facilitates lifting of the cash register cover 5 to remove the cash register cover 5 from the cash box, leaving the panel mount tabs 29 secured to the cash box 3. The conventional cash register 1 is then exposed for easy maintenance or replacement. Replacement of the cash register cover 5 on the cash box 3 is achieved by reversing the removal operation and manipulating the cash register cover 5 to place the respective flange lip slots 28 in registration with the companion fixed panel mount tabs 29 and subsequently shifting the cash register cover 5 to the right to again engage the tab flanges 30 of each panel mount tab 29 with the companion flange lip 27, to again secure the cash register cover 5 to the cash box 3. The tab mount screws 32 are then reinserted in the tab mount screw openings 33 and the receptacle openings 31a in the tab screw receptacles 31 of each of the panel mount tabs 29. Alternatively, other panel mount tabs 29 can be provided in registration with the flange lip slots 28 provided in the flange lips 27 of the side panel bottom flanges 20a, as described above. The cash register cover 5 can then be removed by sliding it forwardly or rearwardly, depending upon the orientation of the tab flanges 30, and lifting.

It will be further appreciated by those skilled in the art that various design features of the cash register cover 5 of this invention can be altered without departing from the spirit and scope of the invention. For example, various locations for the keys 58, in combination with a cooperating keyboard of corresponding size and spacial orientation borrowed from the underlying conventional cash register, can be utilized in the keyboard panel plate 47. Similarly, the door plate 64 of the printer access door 63 can be positioned in various locations in the keyboard panel plate 47 of the keyboard panel 45, according to the design of the underlying cash register 1. Furthermore, referring again to FIGS. 7 and 10 of the drawings, multiple serrated indication mount brackets 78, with companion traveling brackets 88, as well as the universal bracket 96, can be slidably mounted in aligned and/or reverse relationship on the indication mount bar 69, to position one or more indication printed circuit boards 77 such that separate indication printed circuit boards 77 of selected size are facing both the customer and the operator of the cash register 1. Furthermore, the indication printed circuit boards 77 can be designed not only to indicate various combinations of numbers in a conventional cash register function, but also to print messages, both moving and stationary, which advertise sales, store information and like indicia, according to the knowledge of those skilled in the art.

While the preferred embodiments of the invention have been described above, it will be recognized and understood that various modifications may be made therein and the appended claims are intended to cover all such modifications which may fall within the spirit and scope of the invention.

Having described my invention with the particularity set forth above, what is claimed is:

1. A cash register cover for enclosing and operating a cash register having a cash box and a keyboard, said cash register cover comprising a front panel; a rear panel spaced from said front panel; a pair of side panels disposed in spaced, substantially parallel relationship with respect to each other, said side panels disposed in substantially perpendicular relationship with respect to said front panel and said rear panel and said side panels interconnecting said front panel and said rear panel to define a cover perimeter; a keyboard panel engaging said front panel and abutting said side panels and partially closing said cover perimeter for receiving the keyboard; and indication means closing said cover perimeter between said keyboard panel and said rear panel for supporting and enclosing at least one indication printed circuit board and displaying selected indicia on the indication printed circuit board responsive to operation of the keyboard.

2. The cash register cover of claim 1 further comprising a paper slot provided in said keyboard panel for dispensing printed tape from the cash register.

3. The cash register cover of claim 1 further comprising surface ornamentation provided on said front panel, said rear panel and said side panels.

4. The cash register cover of claim 1 further comprising a side panel border provided on each of said side panels.

5. The cash register cover of claim 2 further comprising:
  (a) surface ornamentation provided on said front panel, said rear panel and said side panels; and
  (b) a side panel border provided in each of said side panels.

6. The cash register cover of claim 2 wherein said front panel, said rear panel and said side panels are seated on the cash box and further comprising panel mount means attached to the cash box and removably secured to selected areas on said cover perimeter, whereby said cash register cover is removably secured to the cash box.

7. The cash register cover of claim 6 further comprising:
  (a) surface ornamentation provided on said front panel, said rear panel and said side panels; and
  (b) a side panel border provided in each of said side panels.

8. The cash register cover of claim 6 further comprising a rear panel bottom flange provided in the bottom edge of said rear panel and at least one rear flange lip slot provided in said rear panel bottom flange and wherein said panel mount means further comprises at least one rear panel mount tab secured to the cash box, said rear panel mount tab positioned in said rear flange lip slot in slidable relationship; a rear tab flange projecting from one end of said rear panel mount tab and normally engaging said rear panel bottom flange when said rear panel mount tab is oriented in removably secured configuration; and a first fastener extending through said rear panel bottom flange and engaging said rear panel mount tab for maintaining said rear tab flange in engagement with said rear panel bottom flange, whereby said rear panel bottom flange is displaced from beneath said rear tab flange and said cash register cover is removable from the cash box when said first fastener is removed and said cash register cover is slidably adjusted to align said rear tab flange with said rear flange lip slot.

9. The cash register cover of claim 8 further comprising:
   (a) surface ornamentation provided on said front panel, said rear panel and said side panels; and
   (b) a side panel border provided in each of said side panels.

10. The cash register cover of claim 9 further comprising a front panel bottom flange provided in the bottom edge of said front panel; at least one front flange lip slot provided in said front panel bottom flange; at least one front panel mount tab secured to the cash box, said front panel mount tab positioned in said front flange lip slot in slidable relationship; a front tab flange projecting from one end of said front panel mount tab and normally engaging said front panel bottom flange when said front panel mount tab is oriented in removably secured configuration; and a second fastener extending through said front panel bottom flange and engaging said front panel mount tab for maintaining said front tab flange in engagement with said front panel bottom flange, whereby said front panel bottom flange is displaced from beneath said front tab flange and said cash register cover is removable from the cash box when said second fastener is removed and said cash register cover is slidably adjusted to align said front tab flange with said front flange lip slot.

11. The cash register cover of claim 1 wherein said indication means further comprises an indication mount bar spanning said side panels in fixed relationship; indication mount bracket means slidably carried by said indication mount bar for supporting the indication printed circuit board; and indication cover means enclosing said indication mount bracket means.

12. The cash register cover of claim 11 further comprising panel mount means attached to the cash box and removably secured to selected areas on said cover perimeter, whereby said cash register cover is removably secured to the cash box.

13. The cash register cover of claim 12 further comprising a rear panel bottom flange provided in the bottom edge of said rear panel; and at least one rear flange lip slot provided in said rear panel bottom flange and wherein said panel mount means further comprises at least one rear panel mount tab secured to the cash box, said rear panel mount tab positioned in said rear flange lip slot in slidable relationship; a rear tab flange projecting from one end of said rear panel mount tab and normally engaging said rear panel bottom flange when said rear panel mount tab is oriented in removably secured configuration; and a first fastener extending through said rear panel bottom flange and engaging said rear panel mount tab for maintaining said rear tab flange in engagement with said rear panel bottom flange, whereby said rear panel bottom flange is displaced from beneath said rear tab flange and said cash register cover is removable from the cash box when said first fastener is removed and said cash register cover is slidably adjusted to align said rear tab flange with said rear flange lip slot; and further comprising a front panel bottom flange provided in the bottom edge of said front panel; at least one front flange lip slot provided in said front panel bottom flange; at least one front panel mount tab secured to the cash box, said front panel mount tab positioned in said front flange lip slot in slidable relationship; a front tab flange projecting from one end of said front panel mount tab and normally engaging said front panel bottom flange when said front panel mount tab is oriented in removably secured configuration; and a second fastener extending through said front panel bottom flange and engaging said front panel mount tab for maintaining said front tab flange in engagement with said front panel bottom flange, whereby said front panel bottom flange is displaced from beneath said front tab flange and said cash register cover is removable from the cash box when said second fastener is removed and said cash register cover is slidably adjusted to align said front tab flange with said front flange lip slot.

14. The cash register cover of claim 13 further comprising:
   (a) a paper slot provided in said keyboard panel for dispensing printed tape from the cash register;
   (b) surface ornamentation provided on said front panel, said rear panel and said side panels; and
   (c) a side panel border provided in each of said side panels.

15. The cash register cover of claim 14 wherein said indication cover means is a generally U-shaped indication cover and further comprising at least two indication cover brackets secured to said indication cover, said indication cover brackets adapted to removably engage said rear panel and said keyboard panel and removably mount said indication cover over said indication mount bracket means.

16. The cash register cover of claim 15 further comprising a pair of generally U-shaped border slots provided in said side panel border for receiving and recessing the ends of said indication cover.

17. The cash register cover of claim 11 wherein said indication mount bracket means further comprises:
   (a) at least one first serrated indication mount bracket provided with an upward-standing serrated plate and a pair of spaced-apart mount bar fingers for slidably engaging said indication mount bar; and
   (b) at least one traveling bracket and a pair of base clips fixedly attached to said traveling bracket, said base clips adapted to engage said serrated plate of said serrated indication mount bracket and receive an indication printed circuit board of selected width.

18. The cash register cover of claim 17 further comprising panel mount means attached to the cash box and removably secured to selected areas on said cover perimeter, whereby said cash register cover is removably secured to the cash box.

19. The cash register cover of claim 18 further comprising a rear panel bottom flange provided in the bottom edge of said rear panel; and at least one rear flange lip slot provided in said rear panel bottom flange and wherein said panel mount means further comprises at least one rear panel mount tab secured to the cash box, said rear panel mount tab positioned in said rear flange lip slot in slidable relationship; a rear tab flange projecting from one end of said rear panel mount tab and normally engaging said rear panel bottom flange when said rear panel mount tab is oriented in removably secured configuration; and a first fastener extending through said rear panel bottom flange and engaging said rear panel mount tab for maintaining said rear tab flange in engagement with said rear panel bottom flange, whereby said rear panel bottom flange is displaced from beneath said rear tab flange and said cash register cover is removable from the cash box when said first fastener is removed and said cash register cover is slidably adjusted to align said rear tab flange with said rear flange lip slot; and further comprising a front panel bottom flange provided in the bottom edge of said front panel; at least one front flange lip slot provided in said front panel bottom flange; at least one front panel mount tab secured to the cash box, said front panel mount tab positioned in said front flange lip slot in slidable relationship; a front tab flange projecting from one end of said front panel mount tab and normally engaging said front panel bottom flange when said front panel mount tab is oriented in removably secured configuration; and a second fastener extending through said front panel bottom flange and engaging said front panel mount tab for maintaining said front tab flange in engagement with said front panel bottom flange, whereby said front panel bottom flange is displaced from beneath said front tab flange and said cash register cover is removable from the cash box when said second fastener is removed and said cash register cover is slidably adjusted to align said front tab flange with said front flange lip slot.

20. The cash register cover of claim 19 further comprising:
   (a) a paper slot provided in said keyboard panel for dispensing printed tape from the cash register;
   (b) surface ornamentation provided on said front panel, said rear panel and said side panels; and
   (c) a side panel border provided in each of said side panels.

21. The cash register cover of claim 20 wherein said indication cover means is a generally U-shaped indication cover and further comprising at least two indication cover brackets secured to said indication cover, said indication cover brackets adapted to removably engage said rear panel and said keyboard panel and removably mount said indication cover over said indication mount bracket means.

22. The cash register cover of claim 21 further comprising a pair of generally U-shaped border slots provided in said side panel borders for receiving and recessing the ends of said indication cover.

23. The cash register cover of claim 22 further comprising an upward-standing decorative panel carried by said indication cover.

24. A cash register cover for mounting on the cash box of a cash register having a removable keyboard provided with keys, said cash register cover adapted for and enclosing and operating the cash register, comprising:
   (a) a pair of side panels disposed in substantially parallel, upward-standing relationship on the cash box;
   (b) at least two side panel brackets carried by each of said side panels;
   (c) a front panel disposed in upward-standing relationship on the cash box and spanning one end of said side panels;
   (d) a pair of front panel brackets carried by said front panel, said front panel brackets adapted to engage a first pair of said side panel brackets, respectively, and secure said front panel to said side panels;
   (e) a rear panel disposed in upward-standing relationship on the cash box and spanning the opposite ends of said side panels;
   (f) a pair of rear panel brackets carried by said rear panel, said rear panel brackets adapted to engage a second pair of said side panel brackets, respectively, and secure said rear panel to said side panels, to define a cover perimeter;
   (g) a keyboard panel engaging said front panel and said side panels and partially closing said cover perimeter for receiving the keyboard and electrical wiring connecting the keyboard to the enclosed cash register; and
   (h) indication means inserted between said keyboard panel and said rear panel for enclosing at least one indication printed circuit board for displaying alphanumeric message indicia responsive to manipulation of the keys and operating the cash register.

25. The cash register cover of claim 24 further comprising a paper slot provided in said keyboard panel for dispensing printed tape from the cash register.

26. The cash register cover of claim 25 further comprising surface ornamentation provided on said front panel, said rear panel and said side panels.

27. The cash register cover of claim 26 further comprising a side panel border provided on each of said side panels.

28. The cash register cover of claim 27 further comprising panel mount means attached to the cash box and removably secured to selected areas on said cover perimeter, whereby said cash register cover is removably secured to the cash box.

29. The cash register cover of claim 28 further comprising a rear panel bottom flange provided in the bottom edge of said rear panel and at least one rear flange lip slot provided in said rear panel bottom flange and wherein said panel mount means further comprises at least one rear panel mount tab secured to the cash box, said rear panel mount tab positioned in said rear flange lip slot in slidable relationship; a rear tab flange projecting from one end of said rear panel mount tab and normally engaging said rear panel bottom flange when said rear panel mount tab is oriented in removably secured configuration; and a first fastener extending through said rear panel bottom flange and engaging said rear panel mount tab for maintaining said rear tab flange in engagement with said rear panel bottom flange, whereby said rear panel bottom flange is displaced from beneath said rear tab flange and said cash register cover is removable from the cash box when said first fastener is removed and said cash register cover is slidably adjusted to align said rear tab flange with said rear flange lip slot; and further comprising a front panel bottom flange provided in the bottom edge of said front panel; at least one front flange lip slot provided in said front panel bottom flange; at least one front panel mount tab secured to the cash box, said front panel mount tab positioned in said front flange lip slot in slidable relationship; a front tab flange projecting from one end of said front panel mount tab and normally engaging said front panel bottom flange when said front panel mount tab is oriented in removably secured configuration; and a second fastener extending through said front panel bottom flange and engaging said front panel mount tab for maintaining said front tab flange in engagement with said front panel bottom flange, whereby said front panel bottom flange is displaced from beneath said front tab flange and said cash register cover is removable from the cash box when said second fastener is removed and said cash register cover is slidably adjusted to align said front tab flange with said front flange lip slot.

30. The cash register cover of claim 29 wherein said indication means further comprises an indication mount bar spanning said side panels in fixed relationship; indication mount bracket means slidably carried by said indication mount bar for supporting the indication printed circuit board; and indication cover means enclosing said indication mount bracket means.

31. The cash register cover of claim 30 wherein said indication cover means is a generally U-shaped indication cover and further comprising at least two indication cover brackets secured to said indication cover, said indication cover brackets adapted to removably engage said rear panel and said keyboard panel and removably mount said indication cover over said indication mount bracket means.

32. The cash register cover of claim 31 further comprising a pair of generally U-shaped border slots provided in said side border for receiving and recessing the ends of said indication cover.

33. The cash register cover of claim 32 wherein said indication mount bracket means further comprises:
(a) at least one first serrated indication mount bracket provided with an upward-standing serrated plate and a pair of spaced-apart mount bar fingers for slidably engaging said indication mount bar; and
(b) at least one traveling bracket and a pair of base clips fixedly attached to said traveling bracket, said base clips adapted to engage said serrated plate of said serrated indication mount bracket and receive an indication printed circuit board of selected height.

34. The cash register cover of claim 33 further comprising an upward-standing decorative panel carried by said indication cover.

35. A cash register cover for mounting on the cash box of an electronic cash register having a removable keyboard, said cash register cover adapted for enclosing and operating the cash register, comprising:
(a) a pair of side panels disposed in substantially parallel, upward-standing relationship on the cash box and side surface ornamentation provided on said side panels;
(b) at least two side panel brackets carried by each of said side panels;
(c) a front panel disposed in upward-standing relationship on the cash box and spanning one end of said side panels and front surface ornamentation provided on said front panel;
(d) a pair of front panel brackets carried by said front panel, said front panel brackets adapted to engage a first pair of said side panel brackets, respectively, and secure said front panel to said side panels;
(e) a rear panel disposed in upward-standing relationship on the cash box and spanning the opposite ends of said side panels;
(f) a pair of rear panel brackets carried by said rear panel, said rear panel brackets adapted to engage a second pair of said side panel brackets, respectively, and secure said rear panel to said side panels, to define a cover perimeter;
(g) a keyboard panel engaging said front panel and said side panels and partially closing said cover perimeter, said keyboard panel adapted to receive the keyboard and electrical wiring connecting the keyboard to the enclosed cash register;
(h) an indication mount bar having the ends thereof attached to said side panels;
(i) indication mount bracket means slidably carried by said indication mount bar for supporting at least one indication printed circuit board; and
(j) a generally U-shaped indication cover removably engaging said rear panel and said keyboard panel, said indication cover adapted to enclose said indication mount bracket means and the indication printed circuit board for displaying alphanumeric message indicia responsive to operation of the keyboard and the cash register.

36. The cash register cover of claim 35 further comprising a border provided on said side panels and a pair of generally U-shaped border slots provided in said side panel border for receiving and recessing the ends of said indication cover.

37. The cash register cover of claim 36 wherein said indication mount bracket means further comprises:
(a) at least one first serrated indication mount bracket provided with an upward-standing serrated plate and a pair of spaced-apart mount bar fingers for slidably engaging said indication mount bar; and
(b) at least one traveling bracket and a pair of base clips fixedly attached to said traveling bracket, said base clips adapted to engage said serrated plate of said serrated indication mount bracket and receive an indication printed circuit board of selected height.

38. The cash register cover of claim 37 further comprising a rear panel bottom flange provided in the bottom edge of said rear panel and at least one rear flange lip slot provided in said rear panel bottom flange and wherein said panel mount means further comprises at least one rear panel mount tab secured to the cash box, said rear panel mount tab positioned in said rear flange lip slot in slidable relationship; a rear tab flange projecting from one end of said rear panel mount tab and normally engaging said rear panel bottom flange when said rear panel mount tab is oriented in removably secured configuration; and a first fastener extending through said rear panel bottom flange and engaging said rear panel mount tab for maintaining said rear tab flange in engagement with said rear panel bottom flange, whereby said rear panel bottom flange is displaced from beneath said rear tab flange and said cash register cover is removable from the cash box when said first fastener is removed and said cash register cover is slidably adjusted to align said rear tab flange with said rear flange lip slot.

39. The cash register of claim 38 further comprising a front panel bottom flange provided in the bottom edge of said front panel; at least one front flange lip slot provided in said front panel bottom flange; at least one front panel mount tab secured to the cash box, said front panel mount tab positioned in said front flange lip slot in slidable relationship; a front tab flange projecting from one end of said front panel mount tab and normally engaging said front panel bottom flange when said front panel mount tab is oriented in removably secured configuration; and a second fastener extending through said front panel bottom flange and engaging said front panel mount tab for maintaining said front tab flange in engagement with said front panel bottom flange, whereby said front panel bottom flange is displaced from beneath said front tab flange and said cash register cover is removable from the cash box when said second fastener is removed and said cash register cover is slidably adjusted to align said front tab flange with said front flange lip slot.

40. The cash register cover of claim 39 further comprising a side panel border provided on each of said side panels and a pair of generally U-shaped border slots provided in said side panel border for receiving and recessing the ends of said indication cover.

41. The cash register cover of claim 38 further comprising an upward-standing decorative panel carried by said indication cover.

* * * * *